May 26, 1970 N. S. PURDOM 3,514,675
SEMI-CONDUCTOR ELEMENTS FOR JUNCTION DEVICES AND THE MANUFACTURE THEREOF
Filed Sept. 3, 1965

United States Patent Office 3,514,675

Patented May 26, 1970

3,514,675

SEMI-CONDUCTOR ELEMENTS FOR JUNCTION DEVICES AND THE MANUFACTURE THEREOF

Neil S. Purdom, London, England, assignor to Westinghouse Brake and Signal Company, Limited, London, England Filed Sept. 3, 1965, Ser. No. 484,872
Claims priority, application Great Britain, Sept. 9, 1964, 36,848/64; Dec. 8, 1964, 49,881/64; Jan. 18, 1965, 2,115/65
Int. Cl. H01l *11/10*
U.S. Cl. 317—235 15 Claims

ABSTRACT OF THE DISCLOSURE

A three-terminal semi-conductor device comprises a body of semi-conductor material which includes four zones of alternate opposite conductivity type such that a p-n junction is provided between each pair of adjacent zones. An impurity material such as nickel introduced into a low resistivity outermost zone reduces the injection efficiency at low current densities while maintaining a high injection efficiency at high current densities.

Figures 1A, 1B, 1C, 1D, 1E:
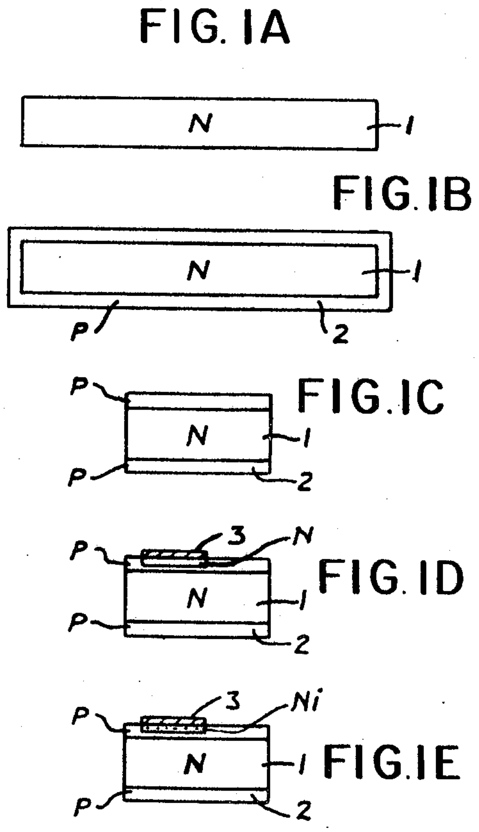

This invention relates to improvements in semi-conductor elements for junction devices, such as semi-conductor controllable rectifiers, and to the manufacture thereof.

In certain of such devices it is desirable to produce one or more junctions, e.g. p-n junctions, in the semi-conductor material for which the efficiency of the injection of minority carriers from one side of the junction to the other is controllably low and, in particular, is low at low current densities and is high at high current densities.

The minority carrier injection efficiency of most, if not all, p-n junctions does appear to behave in this manner to a limited extent but, for some specific devices, it is difficult to reduce the low current density injection efficiency sufficiently without reducing the high current density injection efficiency to a prohibitive extent.

An example of such a specific device is a semi-conductor controllable rectifier embodying, for example, a so-called silicon sandwich.

Such a rectifier comprises, typically, a p-n-p sandwich in one of the outer p-layers of which there is formed a further n-region providing a junction of the type referred to above and thus a p-n-p-n device.

The parameters which are affected by the injection efficiency of this junction are as follows:

(a) forward breakover voltage at elevated temperatures,
(b) ability to withstand high rates of rise of forward voltage,
(c) the gate firing current, and
(d) the forward voltage drop in the conducting state.

Now (a) and (b) require a low injection efficiency from the n-region to the adjacent p-layer in the junction at low current densities while (c) and (d) require a high efficiency at high current densities. Typical figures, heretofore, if (c) and (d) are maintained within reasonable limits, result in the operating temperature being limited to about 125° C. and the rate of rise of forward voltage being limited to about 25 volts per micro-second.

According to the present invention, therefore, there is provided a semi-conductor element for a junction device in which at least a part of (a) or the junction has been treated to reduce the injection efficiency at low current densities whilst, relatively thereto, maintaining or increasing a high injection efficiency at high current densities.

It has been found that, in this way, the above mentioned figures can be improved upon and the attendant advantages achieved.

The treatment may include the step of doping with a material incorporating a substance chosen from the transition series, including those of Groups IB and IIB.

The doping treatment may be effected by diffusion with a metal, or alloy containing such metal, chosen from the fast-diffusing transition metals.

The metal may be nickel and this may be diffused into the junction, or a part thereof, from a gold-antimony-nickel alloy foil. In manufacturing a silicon semi-conductor element with the use of such a foil, the treatment may be carried out at an initial temperature of between 600° C. and 800° C.

In order that the invention may be understood more fully and readily carried into effect, specific examples of it will now be described with reference to the accompanying drawing.

In the first such example, a slice 1 of n-type silicon (FIG. 1A) is cut from a mono-crystalline rod and is lapped to a thickness of about 8 to 12 mils.

It is then diffused with an acceptor element 2 (FIG. 1B) such as gallium, to form a p-type region round the outside of the slice to a depth of about 2 to 3 mils.

The slice is then cut into pellets by any convenient method, providing a p-n-p "sandwich" or junction element as shown in FIG. 1C.

A foil 3 of gold-antimony alloy of between 1.5 to 3 mils is then alloyed on to one face of the pellet (FIG. 1D) at a suitable temperature, typically 600°–800° C. so that regrown silicon is deposited from the alloy during cooling and containing sufficient antimony to dope the adjacent silicon region into n-type conductivity as illustrated by FIG. 1D.

The regrown n-type region thus provides the fourth layer of a p-n-p-n controlled rectifier sandwich device.

A thin layer of a fast-diffusing transition metal, in this example nickel, is next deposited on top of the gold antimony foil. This may be done by direct plating from solution or in any other suitable manner such as by adding a further component, e.g. disc or ring, already plated with the requisite quantity of nickel, a typical amount of nickel, by weight, being about 0.01 to 1.0 percent of the gold-antimony alloy.

The further component has to be of a suitable material not to cause strain through differential thermal expansion and is thus conveniently made of molybdenum.

The silicon sandwich with the added nickel is then heated to a temperature sufficiently high to cause the gold-antimony-silicon alloy to melt and absorb the nickel, but lower than that the original temperature at which the gold-antimony was alloyed to the silicon.

By this means the part, and preferably only a portion, of the n-type layer in the upper p-type layer which is absorbed by the alloy at this lower temperature and subsequently re-deposited on cooling is doped with nickel to the requisite concentration. This is illustrated somewhat diagrammatically by the dotted line at Ni in FIG. 1E.

The method described above permits the production of a controlled rectifier device which can maintain a blocking voltage greater than 1,000 volts at an operating temperature of at least 125° C. and a rate of rise of forward voltage better than 200 volts per micro-second.

In a second example, now to be described, the doping treatment is effected by means of a gold-antimony nickel alloy.

In this method of carrying the invention into effect a basic silicon controlled rectifier sandwich element, such as that shown at FIG. 1C, is produced in the manner already described and a gold-antimony-nickel alloy foil is then alloyed on to the p-n-p junction element. The foil of gold-antimony-nickel alloy is conveniently of about 1.5 to 3 mils thick and is placed on one p-face of the junction element, the foil alloy having a nickel content, by weight, of between 0.5 percent and 5 percent and an antimony content of between 0.1 percent and 1.0 percent.

The junction element is then subjected to heat treatment at about 600° to 800° C. so that regrown silicon is deposited from the foil alloy during cooling and containing sufficient antimony to dope the adjacent silicon region into n-type conductivity, such as is again illustrated by FIG. 1D.

The regrown n-type region thus provides the fourth layer of a p-n-p-n controlled rectifier junction element.

The heat treatment causes the n-type region in the upper p-type layer of the element to be diffused with nickel to a concentration determined by the initial contents of the gold-antimony-nickel alloy.

The method just described above again permits the production of a controlled rectifier device which can maintain a blocking voltage greater than 1,000 volts at an operating temperature of at least 125° C. and at a rate of rise of forward voltage better than 200 volts per micro-second.

In the preceding two examples of carrying out the invention, the doping material has been nickel, but other metals chosen from the transition series, including those of Groups IB and IIB, or an alloy containing such a metal, may be used.

In particular, the metal may be chosen from the fast-diffusing transition metals, of which in addition to nickel may be mentioned iron, cobalt, copper and zinc.

The chosen element or metal may be alloyed, for example, with gold and antimony.

The percentage of metal, or alloy, by weight, may be in the region of about 0.1 percent to 5 percent and it is again conveniently deposited on the junction element in the form of a foil.

A part only of a junction may be so treated and, in the case of a semi-conductor controlled rectifier, a part of the injecting layer may be diffused with an appropriate concentration of the metal or alloy. By reducing the injection efficiency in this way it is possible to obtain results of the order of hundreds of volts per micro-second rate of rise of forward voltage while maintaining gate firing current and forward current drop at reasonable levels.

It will be appreciated that the invention may be applied to p-n as well as to n-p junctions.

Having thus described my invention, what I claim is:

1. A three-terminal semi-conductor device comprising a body of semi-conductor material comprising four zones of alternate opposite conductivity type such that a p-n junction is provided between each pair of adjacent zones, one of the outermost of said zones being of relatively low resistivity and forming with the adjacent zone the emitter junction of the device, and a metal from the group consisting of nickel, iron, cobalt, copper and zinc for doping said outermost low resistivity zone to reduce the injection efficiency of said emitter junction at low current densities while at least maintaining a high injection efficiency at high current densities.

2. A method of producing a three-terminal semi-conductor device comprising a body of semi-conductor material having four zones of alternate opposite conductivity type such that a p-n junction is provided between each pair of adjacent zones, one of the outermost zones being of a relatively low resistivity and forming with the adjacent zone the emitter junction of the device, said method comprising doping of the said outermost low resistivity zone with a metal from the group consisting of nickel, iron, cobalt, copper and zinc to reduce the injection efficiency of the emitter junction at low current densities and alloying a gold-antimony foil to one face of said outermost low resistivity zone at a temperature between 600° C. and 800° C. prior to said doping step.

3. A method of producing a three-terminal semi-conductor device comprising a body of semi-conductor material having four zones of alternate opposite conductivity type such that a p-n junction is provided between each pair of adjacent zones, one of the outermost zones being of a relatively low resistivity and forming with the adjacent zone the emitter junction of the device, said method comprising doping of the said outermost low resistivity zone with a metal from the group consisting of nickel, iron, cobalt, copper and zinc to reduce the injection efficiency of the emitter junction at low current densities and alloying a gold-antimony foil to one face of said outermost low resistivity zone at a temperature between 600° C. and 800° C. simultaneously with said doping step.

4. A semi-conductor element as claimed in claim 1, in which the metal is nickel.

5. A semi-conductor element as claimed in claim 1, in which the metal has been alloyed with gold and antimony.

6. A semi-conductor element as claimed in claim 5, in which the percentage of nickel, by weight, is between 0.5 percent and 5 percent and that of antimony between 0.1 percent and 1 percent.

7. A semi-conductor element as claimed in claim 5, in which the percentage of nickel by weight, is between 0.01 percent and 1.0 percent of that of the gold-antimony.

8. A semi-conductor element as claimed in claim 1, in which the metal is alloyed with gold and antimony and in which the percentage of the metal, by weight, is between 0.1 percent and 5 percent.

9. A method as claimed in claim 2, further including the steps of depositing a layer of nickel on the alloyed gold-antimony foil and diffusing the nickel at a temperature less than that at which the foil was alloyed.

10. A method as claimed in claim 9, in which the nickel is deposited by plating.

11. A method as claimed in claim 9, in which the nickel is deposited by the addition of a nickel-plated component to the alloyed gold-antimony foil.

12. A method as claimed in claim 2, in which the gold-antimony alloy foil includes the addition of between 0.5 percent and 5 percent, by weight, of nickel and the percentage, by weight, of the antimony is between 0.1 percent and 1 percent.

13. A method as claimed in claim 10, in which the percentage of nickel, by weight, is between 0.01 percent and 1.0 percent of that of the gold-antimony foil.

14. A method as claimed in claim 2, including the steps of preparing a silicon slice of one conductivity type, diffusing the slice with an appropriate element to form a region around the exterior thereof of the opposite conductivity type, cutting the slice into pellets to form a junction element, alloying a foil of gold-antimony on to one face of the junction element, the foil having a transition metal content of between 0.01 percent and 5 percent, by weight, and the alloying being carried out at a temperature of between 600° C. and 800° C.

15. A method as claimed in claim 11, in which the percentage of nickel, by weight, is between 0.01% and 1.0% of that of the gold-antimony foil.

References Cited

UNITED STATES PATENTS

| | | | |
|---|---|---|---|
| 2,813,233 | 11/1957 | Shockley | 148—1.5 |
| 2,964,689 | 12/1960 | Buschert et al. | 148—1.5 |
| 2,980,832 | 4/1961 | Stein et al. | 148—185 |
| 3,152,024 | 10/1964 | Diedrich | 148—186 |
| 3,012,175 | 12/1961 | Jones et al. | 148—185 |
| 3,208,889 | 9/1965 | Emeis | 148—185 |

RICHARD O. DEAN, Primary Examiner

U.S. Cl. X.R.

148—33, 177, 178, 185